(12) United States Patent
Yin

(10) Patent No.: US 8,930,875 B2
(45) Date of Patent: Jan. 6, 2015

(54) ESTIMATING POWER SUPPLY OF A 3D IC

(71) Applicant: International Business Machines Corporation, Armonk, NY (US)

(72) Inventor: Wen Yin, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/071,898

(22) Filed: Nov. 5, 2013

(65) Prior Publication Data

US 2014/0157222 A1 Jun. 5, 2014

(30) Foreign Application Priority Data

Nov. 30, 2012 (CN) .......................... 2012 1 0506993

(51) Int. Cl.
*G06F 17/50* (2006.01)

(52) U.S. Cl.
CPC .................................. *G06F 17/5036* (2013.01)
USPC ........... 716/133; 716/118; 716/119; 716/122; 716/132

(58) Field of Classification Search
USPC .......................... 716/118–119, 122, 132–133
See application file for complete search history.

(56) References Cited

U.S. PATENT DOCUMENTS

| | | | | |
|---|---|---|---|---|
| 5,872,952 A * | 2/1999 | Tuan et al. | ..................... | 714/724 |
| 6,311,147 B1 * | 10/2001 | Tuan et al. | ....................... | 703/18 |
| 6,421,814 B1 * | 7/2002 | Ho | ................................ | 716/113 |
| 6,438,729 B1 * | 8/2002 | Ho | ................................ | 716/113 |
| 6,523,154 B2 * | 2/2003 | Cohn et al. | ..................... | 716/112 |
| 7,266,797 B2 | 9/2007 | Bakir et al. | | |
| 7,331,023 B2 * | 2/2008 | Sercu et al. | .................... | 716/136 |
| 7,676,351 B2 * | 3/2010 | Jandhyala et al. | ................. | 703/2 |
| 7,856,608 B2 | 12/2010 | Moriyama | | |
| 7,975,253 B2 | 7/2011 | Iwakura et al. | | |
| 8,200,445 B2 | 6/2012 | Kashiwakura | | |
| 8,539,422 B2 * | 9/2013 | Dai et al. | ........................ | 716/133 |
| 2002/0112212 A1 * | 8/2002 | Cohn et al. | ........................ | 716/1 |
| 2005/0198599 A1 * | 9/2005 | Sercu et al. | ........................ | 716/4 |
| 2008/0022233 A1 * | 1/2008 | Douriet | ............................ | 716/1 |
| 2008/0184176 A1 * | 7/2008 | Takase | ............................... | 716/2 |
| 2009/0024969 A1 * | 1/2009 | Chandra | ........................... | 716/5 |
| 2010/0005437 A1 * | 1/2010 | McIlrath | ......................... | 716/10 |
| 2011/0270598 A1 | 11/2011 | Zou et al. | | |

(Continued)

OTHER PUBLICATIONS

Zaw Zaw OO et al., "Systematic analysis for static and dynamic drops in power supply grids of 3-d integrated circuits," Electromagnetic Compatibility (APEMC), 2012 Asia-Pacific Symposium.

*Primary Examiner* — Stacy Whitmore
(74) *Attorney, Agent, or Firm* — Matthew C. Zehrer; Steven J. Meyers

(57) ABSTRACT

Embodiments of present invention include a method and apparatus of estimating power supply of a 3D IC. The method particularly includes obtaining current information and layout information of circuit modules contained in a specific region of the 3D IC, gridding the specific region so as to form at least one three-dimensional grid having a plurality of side edges along chip stacking direction of the 3D IC, determining current of at least one of the plurality of side edges based on the current information and layout information of the circuit modules, and estimating power supply of the 3D IC based on the current of the at least one side edge. With the method and apparatus embodiments of the invention, power supply of a 3D IC may be effectively estimated and analyzed.

9 Claims, 8 Drawing Sheets

(56) References Cited

U.S. PATENT DOCUMENTS

| | | | |
|---|---|---|---|
| 2011/0314437 A1* | 12/2011 | McIlrath | 716/139 |
| 2012/0025403 A1* | 2/2012 | Yokogawa | 257/786 |
| 2012/0049947 A1 | 3/2012 | Arsovski et al. | |
| 2012/0079438 A1* | 3/2012 | Paciaroni et al. | 716/103 |
| 2012/0260226 A1* | 10/2012 | Kumagai et al. | 716/120 |
| 2012/0317528 A1* | 12/2012 | McIlrath | 716/112 |
| 2013/0198704 A1* | 8/2013 | Hogan | 716/109 |

* cited by examiner

INTRA-CHIP uTSV

INTER-CHIP uTSV

US 8,930,875 B2

ESTIMATING POWER SUPPLY OF A 3D IC

FIELD

Embodiments of invention generally relate to the design of a three dimensional (3D) integrated circuit (IC) chip, and more specifically, to a method and apparatus of estimating power supply of a 3D IC chip.

DESCRIPTION OF THE RELATED ART

Recent trends in information technology typically require higher demands of processing power. As a result, there is a desire for semiconductor devices to become faster and larger. At the same time, however, users desire that electronic devices that utilize semiconductor devices take smaller form factors. These opposing views drive semiconductor devices to be implemented as high density ICs. To this end, three-dimensional integrated circuit (that is, 3D IC technology) has been proposed to realize a high speed high density integrated circuit. In 3D IC, an integrated circuit comprises a plurality of chips stacked upon each other. The chips may be electrically connected to each one another with TSV (through silicon via) technology.

To reduce energy consumption of IC devices, power gating techniques may be used in 3D IC to perform power switching control on various components in logical circuits of the chips. Specifically, the chips are provided with power gating circuits that include a plurality of power switches to turn off a power supply to the logical circuit when there is no need for a logical circuit component to be operational. However, depending on specific circuit design, the power gating circuits may introduce a large ohmic drop, e.g. IR voltage drop, across both ends thereof. An excessive IR voltage drop will affect functionality and operation of chip components. Also, the power gating circuits' operation on various components of the chips may cause noise within power supply. Excessive noise may damage the controlled logical circuits or degrade their performance.

In a conventional single-chip IC, there are often two methodologies for arranging a power gating circuit, e.g. ring-type design and column-type design. FIG. 1A shows a ring-type design, in which the power gating circuit is arranged around a power domain. FIG. 1B shows a column-type design, in which power switches are inserted into the power domain in form of columns.

SUMMARY

Embodiments of the present invention is proposed in view of the above problems, the purpose of which is to provide an applicable power supply estimation scheme to compensate for deficiencies of prior art.

According to one embodiments of the invention, there is provided a method of estimating power supply of a 3D IC, including obtaining current information and layout information of circuit modules contained in a specific region of the 3D IC, gridding the specific region so as to form at least one three-dimensional grid having a plurality of side edges along chip stacking direction of the 3D IC, determining current of at least one side edge of the plurality of side edges based on the current information and layout information of the circuit modules, and estimating power supply of the 3D IC based on the current of the at least one side edge.

According to another embodiment of the invention, there is provided an apparatus of estimating power supply of a 3D IC, including an information obtaining unit configured to obtain current information and layout information of circuit modules contained in a specific region of the 3D IC, a gridding unit configured to perform gridding on the specific region so as to form at least one three-dimensional grid having a plurality of side edges along chip stacking direction of the 3D IC, a current determining unit configured to determine current of at least one side edge of the plurality of side edges based on the current information and layout information of the circuit modules, and an estimating unit configured to estimate power supply of the 3D IC based on the current of the at least one side edge.

With the method and apparatus embodiments of the invention, power supply of a 3D IC may be effectively estimated and analyzed for features of the 3D IC.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Figure 1A:
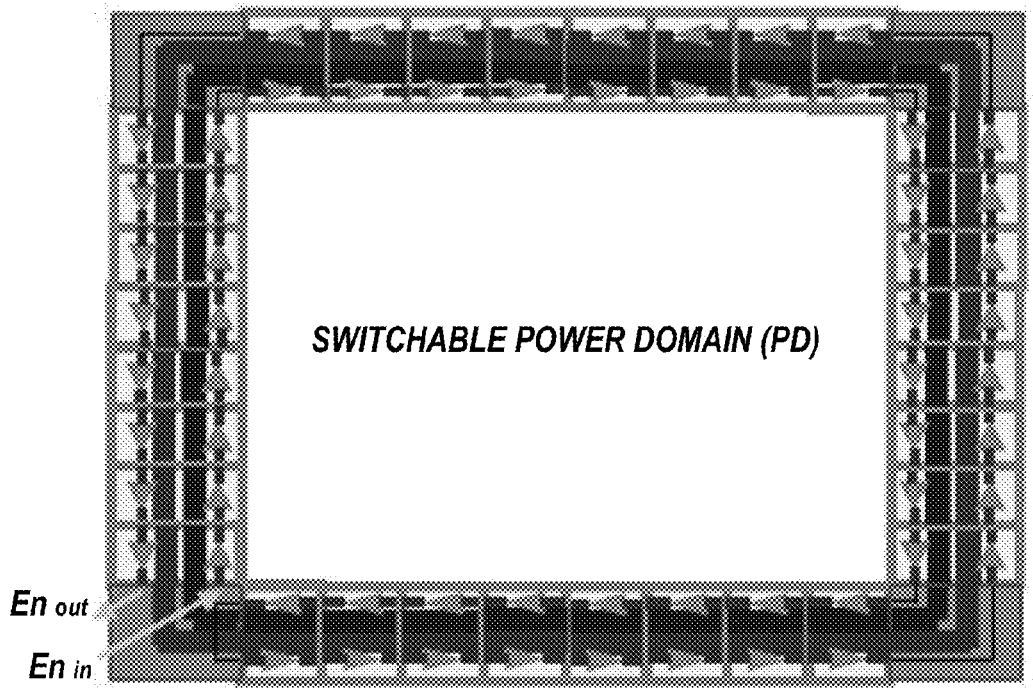
FIG. 1A and FIG. 1B depict diagrams of arrangements of power gating circuits in a single-chip IC.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein. On the contrary, those embodiments are provided for the thorough and complete understanding of the present disclosure and to convey the scope of the present disclosure to those skilled in the art.

As will be appreciated by one skilled in the art, embodiments of the present invention may be embodied as a system, method or computer program product. Accordingly, embodiments of the present invention may take the form of an entirely hardware embodiment, an entirely software embodiment (including firmware, resident software, micro-code, etc.) or an embodiment combining software and hardware embodiments that may all generally be referred to herein as a "circuit," "module" or "system." Furthermore, embodiments of the present invention may take the form of a computer program product embodied in one or more computer readable medium(s) having computer readable program code included thereon.

Any combination of one or more computer readable medium(s) may be utilized. The computer readable medium may be a computer readable signal medium or a computer readable storage medium. A computer readable storage medium may be, for example, but not limited to, an electronic, magnetic, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in base band or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Embodiments of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 1B:
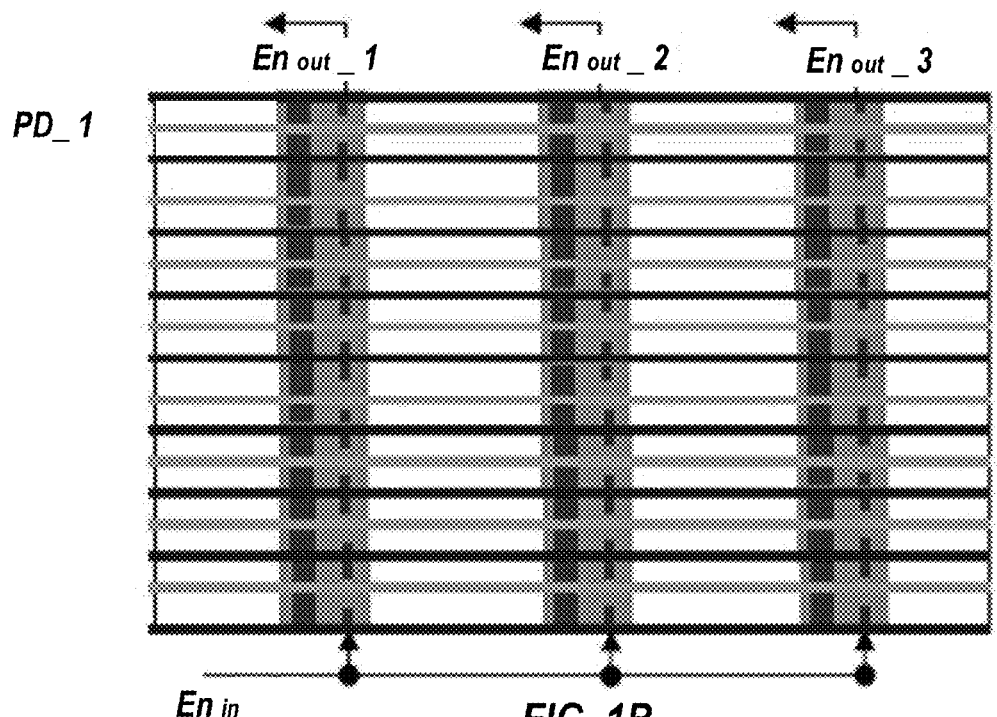
Figure 2A:
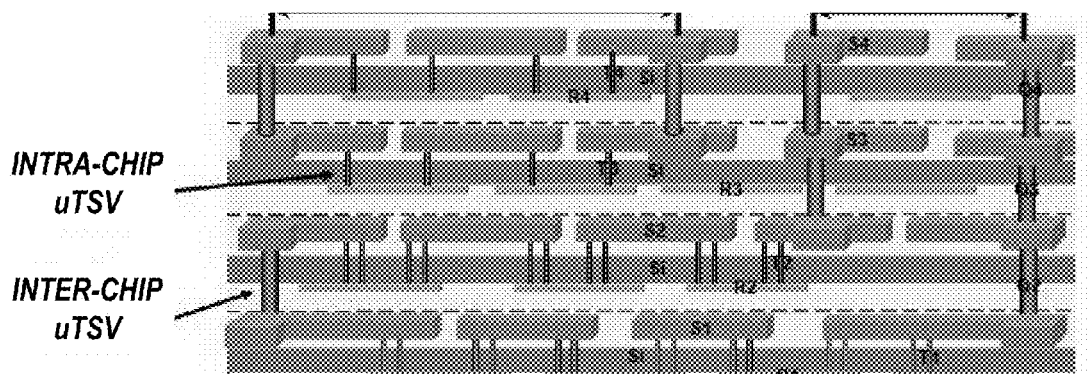
FIG. 2A and FIG. 2B depict diagrams of a 3D IC according to embodiments of the invention.
Figure 2B:
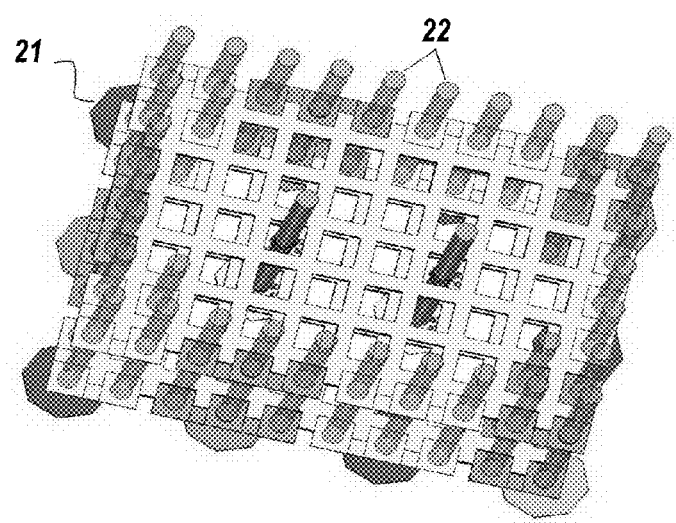

As indicated above, in conventional single-chip IC, there are two methodologies for arranging a power gating circuit, e.g. ring-type design and column-type design. FIG. 1A shows the ring-type design, in which the power gating circuit is arranged around a power domain. FIG. 1B shows the column-type design, in which power switches are inserted into the power domain in form of columns. For a 3D IC, a power gating circuit is arranged differently. FIG. 2A and FIG. 2B show a diagram of a 3D IC, in which FIG. 2A depicts a sectional view of an exemplary 3D IC, and FIG. 2B shows a stereogram of power connections in the 3D IC. The exemplary 3D IC shown in FIG. 2A includes 4 chips stacked together. Each chip comprises a Si substrate onto which various circuit components (shown by S1, S2, S3 and S4) are disposed. Within a chip, circuit connections within the chip are implemented by internal Silicon vias (T1, T2, T3 and T4) and respective metal wires (R1, R2, R3 and R4). Between chips, circuit connections and power supplies between the chips are implemented with connecting columns (e.g., Q2, Q3, Q4) passing through Silicon vias. Typically, the power gating circuit is disposed on top chip or bottom chip and logical circuits are disposed on other chips. However, theoretically, the power gating circuit may be disposed on any chip of a 3D IC or on a plurality of chips therein. It is appreciated that, the diagram in FIG. 2A is merely illustrative, and a 3D IC may be formed by stacking multiple chips with other numbers. In the diagram of FIG. 2B, the power gating circuit is disposed in the bottom chip that is connected to an external power gird via solder balls or pads 21 and controlled power is provided to other chips through connecting columns 22. Thus, in a 3D IC, except for the chip that is directly connected to the external power grid, the chips are supplied power via connecting columns. As shown in FIG. 2B, connecting columns can not only be disposed around chips, but also be disposed within chips. It is appreciated that, connecting columns may be provided in form of any 2-dimensional layout based on need of various active components in the chips.

It can be seen by comparing the diagram of FIG. 1 with that of FIG. 2 that arrangement and power connecting manner of the power gating circuit in a 3D IC is different from that of a single-chip IC. Accordingly, methodologies of estimating and analyzing power supply of a single-chip IC may not be applied to 3D IC. Therefore, it is desired to propose an estimation method suitable for features of 3D IC, so as to facilitate and improve design of power supply in a 3D IC.

Figure 3:
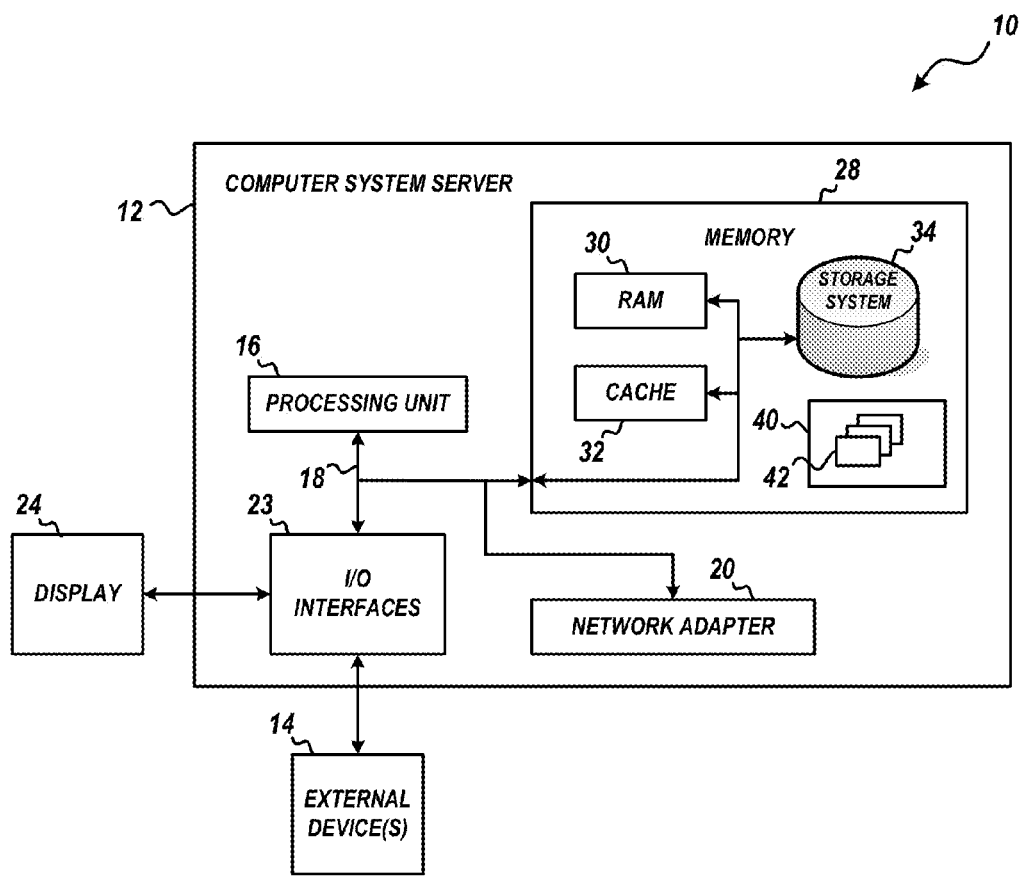
FIG. 3 depicts a block diagram of an exemplary computer system or server that may implement embodiments of the invention.

FIG. 3 depicts a block diagram of an exemplary data handling system, computer system, or server 12, herein referred to as server 12, which is applicable to implement embodiments of the present invention. The server 12 shown in FIG. 3 is only illustrative and is not intended to suggest any limitation as to the scope of use or functionality of embodiments of the invention described herein.

As shown in FIG. 3, server 12 is shown in the form of a general-purpose computing device. The components of server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Server 12 may include a variety of computer readable storage media. Such storage media may be storage media accessible by server 12, including for example, volatile and non-volatile storage media, removable and non-removable storage media.

System memory 28 can include computer readable storage media in the form of volatile memory, such as random access memory (RAM) 30 and/or cache memory 32. Server 12 may further include other removable/non-removable, volatile/non-volatile computer readable storage media. By way of example only, storage system 34 can be provided for reading from and writing to a non-removable, non-volatile magnetic storage media (not shown) such as a hard drive. Although not shown, a magnetic disk drive for reading from and writing to a removable, non-volatile magnetic disk (e.g., floppy disk, etc.), and an optical disk drive for reading from or writing to a removable, non-volatile optical disk such as a CD-ROM, DVD-ROM or other optical storage media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program 40, having a set (at least one) of program modules 42, may be stored in memory 28. By way of example, and not limitation, program 40 may also include an operating system, one or more application programs, other program modules, and program data. Each of the operating system, one or more application programs, other program modules, and program data or some combination thereof, may include an implementation of a networking environment. Program modules 42 may carry out the functions and/or methodologies of embodiments of the invention as described herein.

Server 12 may also communicate with one or more external devices 14 such as a keyboard, a pointing device, a display 24, etc.; one or more devices that enable a user to interact with server 12; and/or any devices (e.g., network card, modem, etc.) that enable server 12 to communicate with one or more other computing devices. Such communication can occur via Input/Output (I/O) interfaces 23. Still yet, server 12 can communicate with one or more networks such as a local area network (LAN), a general wide area network (WAN), and/or a public network (e.g., the Internet) via network adapter 20. As depicted, network adapter 20 communicates with the other components of server 12 via bus 18. It should be understood that although not shown, other hardware and/or software components could be used in conjunction with server 12. Examples, include, but are not limited to: microcode, device drivers, redundant processing units, external disk drive arrays, RAID systems, tape drives, and data archival storage systems, etc.

Embodiments of the invention will be described below in conjunction with accompany drawings and specific examples. According to embodiments of the invention, there is proposed a distributed current model, in which a region to be analyzed in a 3D IC is divided into a plurality of sub-regions, thus forming a plurality of three-dimensional grids having a plurality of side edges along chip stacking direction of the 3D IC. Current at side edges are determined based on current information and layout information of respective circuit modules on chips of the 3D IC. Current distribution in the 3D IC may be obtained based on the calculated current at various side edges. Such current distribution may assist in designing the arrangement of connecting columns between chips or conducting post-verification and post-simulation on current after designing arrangement of connecting columns. Furthermore, by analyzing current at side edges, estimations may be performed on the chip power supply with regards to noise, robustness, etc.

Figure 4:
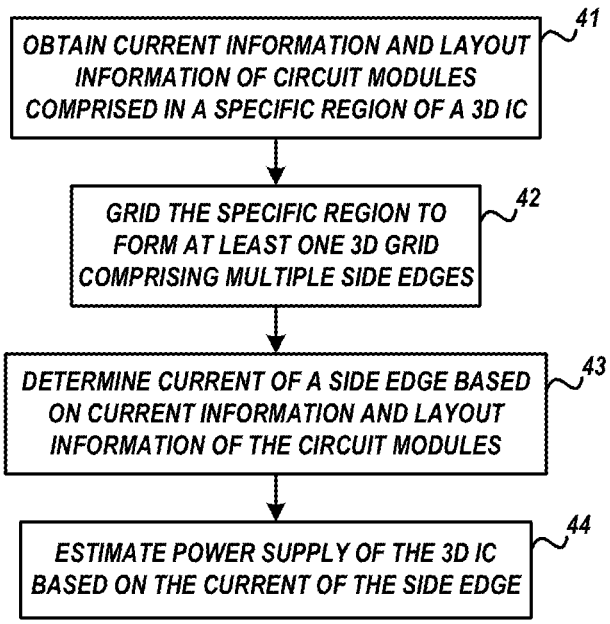
FIG. 4 depicts a flowchart of a method of estimating power supply of a 3D IC according to an embodiment of the invention.

With reference now to FIG. 4, a flowchart of a method of estimating power supply of a 3D IC according to an embodiment of the invention is depicted, wherein the 3D IC comprises a plurality of stacked chips. As shown in FIG. 4, the method includes obtaining current information and layout information of circuit modules contained in a specific region of the 3D IC (block 41). The method also includes gridding the specific region so as to form at least one three-dimensional grid having a plurality of side edges along chip stacking direction of the 3D IC (block 42). The method also includes determining current of at least one side edge of the plurality of side edges based on the current information and layout information of the circuit modules (block 43). The method also include estimating power supply of the 3D IC based on the current of the at least one side edge (block 44). An non limiting implementation of the above method will be described below in conjunction with specific examples.

Generally, in 3D IC design process, a designer determines respective circuit modules that implement logical functions of chips and the layout of the circuit modules. The circuit modules may be various kinds of custom modules that implement specific functions, particularly various pre-designed functional modules such as eDRAM, SDRAM, register etc. In the field of chip design, such circuit module is also referred to as IP (intellectual property) module or IP core. On basis of determining circuit modules on various chips forming the 3D IC and layout of the circuit modules, the designer may conduct estimation on power supply of the 3D IC.

In an embodiment, the method of estimating power supply of a 3D IC comprises block 41 of obtaining current information and layout information of circuit modules contained in a specific region of the 3D IC. It is appreciated that, the above specific region is a region whose power supply is to be analyzed, and that region may be specified by a user as needed. Furthermore, the specific region may be a three-dimensional region according to analysis demand of the 3D IC. In an example, the above specific region includes all of the logical chips in the 3D IC that need to be powered.

To obtain current information of circuit modules within the above specific region, in one embodiment, types of respective circuit modules in the specific region are acquired. According to one embodiment, type information may be acquired by receiving input from a user (e.g. designer, etc.). As mentioned above, circuit modules on various chips of the 3D IC have been determined before estimating power supply; thus, a designer may input, via an interface, types of respective circuit modules contained in the region to be analyzed. According to another embodiment, the designer records the employed circuit modules and connection relationship thereof with a certain file (e.g., netlist, etc.) during designing of logical circuits of chips. Types of circuit modules in the specific region may also be acquired by scanning and identifying the above file. On basis of obtaining the above type information, current information of respective circuit modules may be obtained by searching and querying a circuit module information library. Those skilled in the art can appreciate that, the circuit module information library has already been provided in prior art for recording information of respective circuit modules, including type, size, pin information, operating voltage, current information thereof, etc. Based on the obtained type information, current information of circuit modules of that type may be acquired by querying the circuit module information library. In one embodiment, the current information comprises average current value or standard operating current value during operation of a circuit module. More generally, the current information is recorded in form of an I(t) function, which records change of current I with time t during power on, operation, power off of a circuit module. In an example, the above I(t) function is drawn as a time-domain current waveform graph. In one embodiment, some circuit modules may operate at different operating frequencies, and have different I(t) functions under different operating frequencies. In such a case, the user is also required to specify operating frequency of circuit modules, and further query the circuit module information library based on that operating frequency, so as to accurately obtain current information of circuit modules.

In addition, since layout of respective circuit modules has already been determined by the designer, layout information of circuit modules may be obtained by receiving input from the designer. Such layout information may include information such as center location, size, shape of respective circuit modules, and so on.

In certain other embodiments, according to a distributed current model proposed by embodiments of the invention, the 3D IC is divided into sub-regions so as to conduct current analysis. To this end, at block 42, the specific region is gridded so as to form at least one three-dimensional grid. Division of the three-dimensional grids may be even or uneven. For purpose of simplicity and convenience, in one embodiment, each three-dimensional grid is a cube or a cuboid. In addition, based on demand of analysis, the three-dimensional grids may also be set as combinations of one or more of a triangular prism, a hexagonal prism or other more complicated shape. However, to simulate powering condition of connecting columns in the 3D IC, the three-dimensional grid is preferable to have parallel side edges along chip stacking direction of the 3D IC. In context of this specification, when a side edge of the three-dimensional grid is mentioned, it refers to a side edge that is parallel to chip stacking direction, without considering edges in other direction. It is appreciated that, granularity of dividing the specific region or size of the three-dimensional grid may be adjusted based on analysis requirement. In an example, it is possible to form only one three-dimensional grid for the specific region. While in another example with relatively high analysis accuracy, finer three-dimensional grids may be formed. In addition, division of three-dimensional grids is also related to distribution of connecting columns to be designed or have been designed. As mention above, except the chip directly connected to an external powering grid, the other chips in the 3D IC get power supply via connecting columns. In case of pre-simulation, that is, in case that power estimation is conducted before determining location of connecting columns, three-dimensional gridding may be performed based on typical pitch of connecting columns, such that characteristic dimension of the three-dimensional grid has a particular proportion or relationship with the above typical pitch. In case of post-simulation in which power estimation is performed after determining location of connecting columns, side edges formed by three-dimensional gridding should be made to be at least in part corresponding to the determined locations of connecting columns. In addition, it is appreciated that, upon reading teaching of this specification, a person skilled in the art is capable of gridding a 3D IC with other proper manners based on demand of analysis, so as to form various forms of three-dimensional grid and to accordingly obtain a plurality of side edges of the three-dimensional grid.

Although block 42 is shown to be performed after block 41 in FIG. 4, it is appreciated that, block 42 may also be performed before block 41 or may be performed in parallel thereto.

On basis of obtaining information of circuit modules at block 41 and gridding the 3D IC at block 42, at block 43, current of at least one side edge is determined based on the current information and layout information of the circuit modules.

In one embodiment, determining current of at least one side edge at block 43 comprises: determining, based on layout information of the circuit modules, distances from the circuit modules to the at least one side edge, thereby determining current distribution weights of the circuit modules to the at least one side edge; performing weighted summation on current of at least a portion of the circuit modules, and taking result of summation as current of the at least one side edge. Specifically, for a side edge i, weight from a circuit module j is determined based on distance from the circuit module j to that side edge i, and the current of that side edge i is determined as result of weighted summation on current of respective circuit modules based on the weight.

In an example, assume current corresponding to circuit module j is $MI_j$, and distance from that circuit module j to side edge i is $r_{ij}$, then current $NI_i$ of the side edge i may be determined as $NI_i = \Sigma MI_j/(r_{ij})^2$, that is, weight corresponding to circuit module j is $1/(r_{ij})^2$. It is appreciated that, based on the current information obtained at block 41, current of the above mentioned circuit module may be a current value or be in form of an I(t) function. In the following description, current of circuit modules include current in form of an I(t) function.

Figure 5:
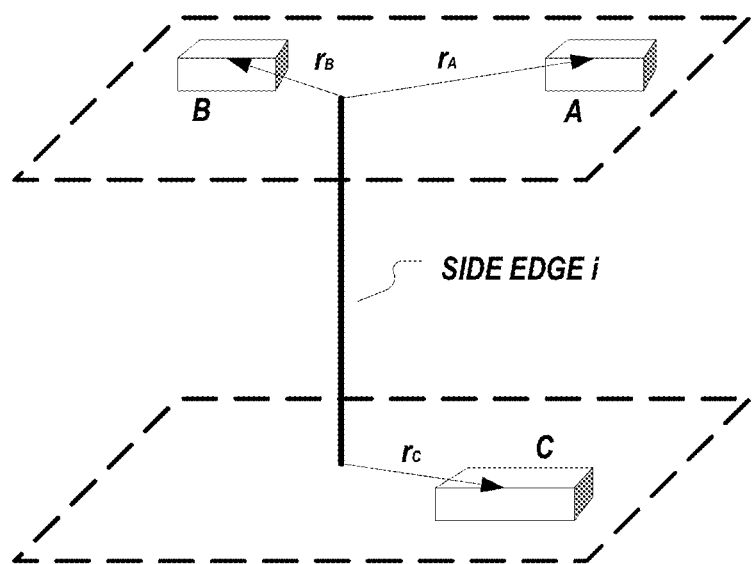
FIG. 5 and FIG. 6 depicts a diagram of determining current of a side edge according to an embodiment of the invention.

FIG. 5 depicts a diagram of determining current of a side edge. In this diagram, the specific region to be analyzed contains three illustrative circuit modules A, B and C. Circuit modules A and B are located in a chip of a same level, and circuit module C is located in a chip at a lower level, and the illustrative side edge i is along the chip stacking direction.

Assume circuit modules A, B and C have current $I_A$, $I_B$, $I_C$ respectively, and distance from the three circuit modules to the side edge i to be analyzed are $r_A$, $r_B$, $r_C$ respectively. In this example, distance from a circuit module to side edge i is calculated as distance from geometrical center of the circuit module to side edge i. According to the above embodiment, current of side edge i may be determined as $NI_i = I_A/r_A^2 + I_B/r_B^2 + I_C/r_C^2$. Although weight is set as $1/(r_{ij})^2$ herein, setting of other weight factor is also possible, as long as the greater the distance from circuit module to side edge, the smaller the weight. In another example, e.g., the weight may also be set as $1/r_{ij}$. Generally, when performing gridding, the formed side edges are made to avoid location of circuit modules, so as to prevent the condition that $r_{ij}=0$. The above method of determining current of a side edge is applicable to a three-dimensional grid with any shape.

In another embodiment, current $NI_i$ of the side edge i is determined as result of weighted summation on current of a portion of circuit modules contained in the specific region, wherein the portion of circuit modules are those circuit modules whose distance to side edge i are less than a predetermined threshold. That is to say, if distance between the circuit module j and side edge i is greater than a predetermined threshold, then it is considered that the circuit module j has no affect on current of side edge i, such that current contribution of that circuit module j will not be taken into consideration when calculating current of side edge i.

On basis of the above described embodiments, those skilled in the art may also make further modification, such as modifying weight factor in weighted summation, modifying the manner of calculating distance, modifying selection of circuit modules on which summation is performed, and so on.

In the foregoing embodiments, current of circuit modules are directly distributed to respective side edges by taking layout of circuit modules into consideration, thereby obtaining current of side edges. As an alternative, current of side edges may also be obtained with the three-dimensional grids formed at block 42.

Figure 6:
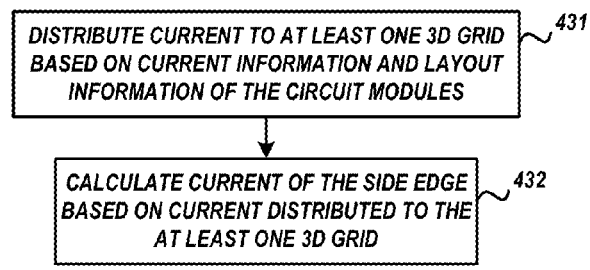

FIG. 6 depicts further methodologies of determining current of a side edge according to an embodiment, that is, sub-methods of block 43 in FIG. 4. As shown in FIG. 6, the sub method includes distributing current to the at least one formed three-dimensional grid based on current information of the circuit modules (block 431). The sub method includes calculating the current of the side edge based on current distributed to the at least one three-dimensional grid (block 432), in other words, current distributed to the three-dimensional grid is further distributed to side edges, thereby determining current of at least one side edge. Performance of the above sub methods will be described below in conjunction with examples.

Distribution of current to the three-dimensional grid in block 431 may be performed in various manners. In one embodiment, current of circuit modules in the above specific region are evenly distributed to the n formed three-dimensional grids. Specifically, the obtained current of respective circuit modules are first superposed together to form total current $I_T$ of that specific region, and then the total current is distributed to the n formed three-dimensional grids. Thus, current distributed to each three-dimensional grid is $I_T/n$.

In one embodiment, current distribution is made by taking volume of the three-dimensional grid into consideration. Specifically, first, total current $I_T$ of that specific region is obtained as mentioned before, and then total volume $V_T$ of that specific region is obtained. For a three-dimensional grid k, volume $V_k$ of that three-dimensional grid is obtained. Accordingly, current distributed to that three-dimensional grid k is set as $I_T V_k/V_T$. In case that three-dimensional grids are evenly formed at block 42, result of this embodiment is the same as that of the foregoing embodiment; but different result will be obtained for uneven three-dimensional grids.

Figure 7:
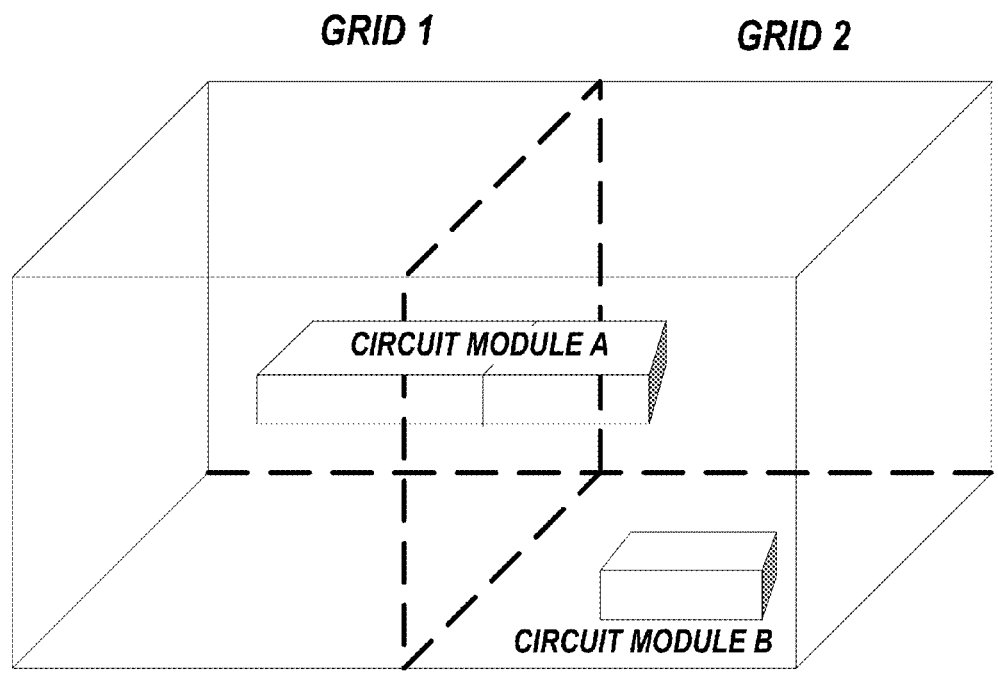
FIG. 7 shows an example of three dimensional grids according to an embodiment of the invention.

In one embodiment, current distribution of three-dimensional grids is made considering circuit modules contained in respective three-dimensional grids. Specifically, for a three-dimensional grid k, circuit modules involved in that three-dimensional grid are obtained based on layout information of circuit modules, and current distributed to that three-dimensional grid k is defined as sum of current of circuit modules contained or partially contained in the three-dimensional grid k. FIG. 7 depicts an example of three dimensional grids. Two adjacent three-dimensional grids 1 and 2 and two related circuit modules A and B are illustratively shown in FIG. 7, wherein a part of circuit module A locates within three-dimensional grid 1, another part thereof locates within grid 2, while circuit module B is totally contained in three-dimensional grid 2. According to this embodiment, current distributed to three-dimensional grid 1 may be determined as $I_A$, current distributed to three-dimensional grid 2 is defined as sum of current of its involved circuit modules A and B, that is, $I_A + I_B$.

In another embodiment, current distribution is made by further considering distribution of circuit modules among different three-dimensional grids. Specifically, for a three-dimensional grid k, a ratio $w_j$ of volume of a related circuit module j falling within the three-dimensional grid k with respect to total volume of that circuit module j is further taken into consideration. Then, current of every circuit module j involved in the three-dimensional grid k is summed with the volume ratio $w_j$ as weight, thereby obtaining current $I_k$ distributed to the three-dimensional grid k, that is, $I_k = \Sigma I_j * w_j$. Still referring to the example in FIG. 7, current distribution is made by taking volume ratio of circuit modules in consideration. For three-dimensional grid 1, it only involves circuit module A, and circuit module A has ⅔ of its volume falling within three-dimensional grid 1. Thus, for three-dimensional grid 1, weight $w_A$ of circuit module A is ⅔, and accordingly, current of three-dimensional grid 1 is $2I_A/3$. For three-dimensional grid 2, its involved circuit modules comprise A and B, in which circuit module A only has ⅓ of its volume falling within three-dimensional grid 2, and thus, for three-dimensional grid 2, weight $w_A$ of circuit module A is ⅓. In addition, circuit module B is totally within three-dimensional grid 2, thus, its volume ratio $w_B=1$. Therefore, current distributed to three-dimensional grid 2 is $I_A/3 + I_B$.

Although several detailed methods for three-dimensional grid current distribution have been listed above, those skilled in the art may combine or extend the methods for three-dimensional grid current distribution under teaching of this specification. Such combination or extension should also be encompassed within conception of the present embodiment. In addition, it is appreciated that, the cubic three-dimensional grid shown in FIG. 7 is merely an illustration. The various methods for three-dimensional grid current distribution above are applicable to three-dimensional grids with various shapes.

Figure 8:
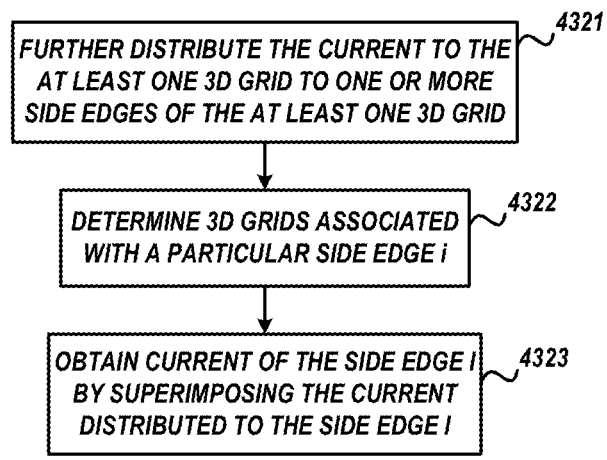
FIG. 8 depicts a diagram of calculating current of a side edge based on current of three dimensional grids according to an embodiment of the invention.

Based on current distributed to three-dimensional grids through various manners above, block 432 may be performed, in which current of a side edge may be calculated by distributing current of three-dimensional grids to the side edges. FIG. 8 depicts methodologies of calculating current of a side edge based on current of three dimensional grids according to an embodiment, that is, sub methods of block 432. As shown in FIG. 8, the process of calculating current of side edge based on current of three-dimensional grids further comprises: distributing current distributed to three-dimensional grids at step 431 further to side edges related to the three-dimensional grids (block 4321); determining, for a side edge i, three-dimensional grids associated with that side edge i (block 4322), and; obtaining current of the side edge i by superposing current distributed to that side edge i from the determined associated three-dimensional grids respectively (block 4323).

Figure 9:
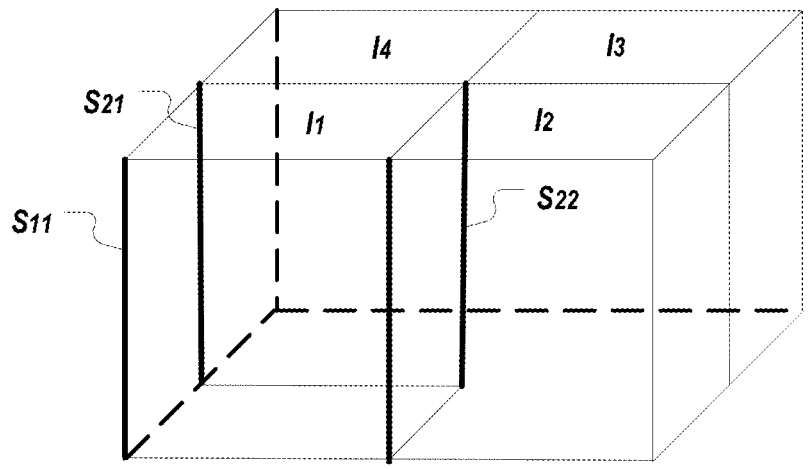
FIG. 9 shows a diagram of current distribution according to an embodiment of the invention.

In one embodiment, at block 4321, current of three-dimensional grids are evenly distributed to related side edges. Then, at blocks 4322-4323, current distributed to a same side edge from different three-dimensional grids is superposed together so as to obtain current of that side edge. FIG. 9 depicts a diagram of current distribution. In the diagram of FIG. 9, 4 three-dimensional grids arranged in 2×2 are shown. Assume current distributed to the 4 three-dimensional grids through the foregoing step 432 are $I_1, I_2, \ldots I_4$, respectively. According to this embodiment, current $I_1$ of three-dimensional grid 1 is evenly distributed to its related four side edges $S_{11}, S_{12}, S_{21}, S_{22}$. Thus, each of the four side edges obtains current $I_1/4$ from three-dimensional grid 1. Similarly, other three-dimensional grids also evenly distribute their current to four related side edges. Several typical side edges $S_{11}, S_{21}$ and $S_{22}$ will be considered below. For side edge $S_{11}$, it can be determined at block 4322 that, $S_{11}$ is only related to three-dimensional grid 1. Thus, at block 4323, current of side edge $S_{11}$ may be calculated as current distributed to that side edge from three-dimensional grid 1, that is, $I_1/4$. For side edge $S_{21}$, it can be determined at block 4322 that, $S_{21}$ is a side edge common to three-dimensional grid 1 and three-dimensional grid 4; thus, $S_{21}$ is related to three-dimensional grid 1 and three-dimensional grid 4. Accordingly, at block 4323, current of side edge $S_{21}$ may be calculated as superposition of current $I_{1/4}$ distributed to that side edge from three-dimensional grid 1 and current $I_{4/4}$ distributed to that side edge from three-dimensional grid 4, that is, $SI_{21}=I_1/4+I_4/4$. Similarly, for side edge $S_{22}$, it can be determined at block 4322 that, side edge $S_{22}$ is related to all the three-dimensional grid 1, three-dimensional grid 2, three-dimensional grid 3 and three-dimensional grid 4. Next, at block 4323, current of side edge $S_{22}$ may be calculated as superposition of current distributed to that side edge from the above 4 three-dimensional grids respectively, that is, $SI_{22}=I_1/4+I_2/4+I_3/4+I_4/4$. Similarly, it is appreciated that, the diagram of three-dimensional grids depicted in FIG. 9 is merely an illustration. The above side edge current distribution methods are applicable to three-dimensional grids with various shapes.

In one embodiment, at block 4321, current of three-dimensional grids are distributed to related side edges based on location distribution of circuit modules contained in the three-dimensional grids. Specifically, for a circuit module j contained in a three-dimensional grid k, distance from the circuit module j to each side edge of the three-dimensional grid k is calculated; current distribution weight of each side edge is determined based the calculated distance, and accordingly, a portion of current of the three-dimensional grid k that is corresponding to the circuit module j is distributed to each side edge based on the determined weight. The above circuit module j may be a full circuit module contained within three-dimensional grid k, or may be a portion of circuit module falling within three-dimensional grid k. Such portion of circuit module is also processed as a separate circuit module.

Figure 10:
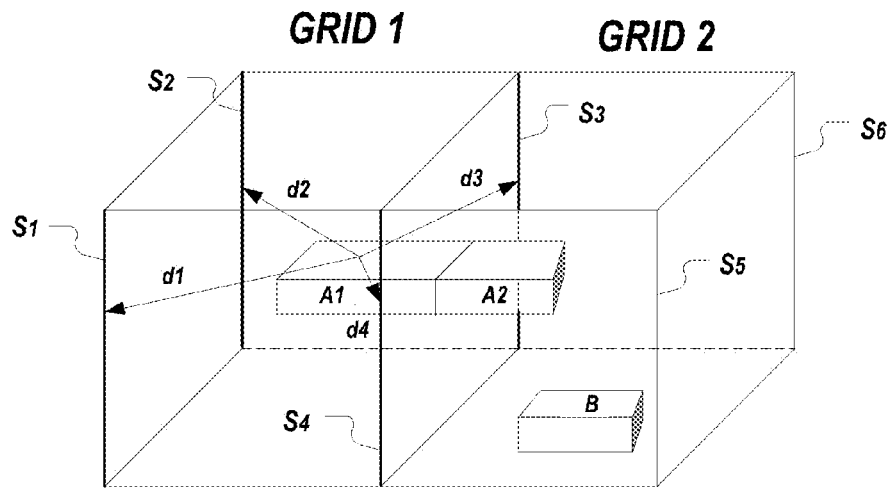
FIG. 10 shows a diagram of side edge current distribution according to an embodiment of the invention.

FIG. 10 depicts a diagram of side edge current distribution, where distribution of three-dimensional grids and distribution of circuit modules in the diagram are the same as that of FIG. 7. Specifically, three-dimensional grid 1 contains a portion (⅔ of volume) of circuit module A. As stated above, that portion of circuit module will be taken as a separate circuit module A1. Accordingly, three-dimensional grid 2 contains circuit module A2 (corresponding to ⅓ of circuit module A) and circuit module B. As described above with reference to FIG. 7, in case that current distribution is made by taking volume ratio of circuit module into consideration, current distributed to three-dimensional grid 1 is $2I_A/3$, and current distributed to three-dimensional grid 2 is $I_A/3+I_B$. To distribute current of three-dimensional grid 1 to related side edges S1, S2, S3, S4, distances d1, d2, d3, d4 from circuit module A1 contained in three-dimensional grid 1 to each side edge are calculated. In an example, the above distances are from geometrical center of the portion of circuit module A1 to each side edge. Based on the calculated distances, current distribution weight of side edges are determined. In one example, e.g., weight of side edge S1 is defined as w1=d1/(d1+d2+d3+d4), weight of side edge S2 is defined as w2=d2/(d1+d2+d3+d4), weight of side edge S3 is defined as w3=d3/(d1+d2+d3+d4), and weight of side edge S4 is defined as w4=d4/(d1+d2+d3+d4). Thus, current distributed from three-dimensional grid 1 to side edge S1 is $w1*2I_A/3$. Similarly, current distributed from three-dimensional grid 1 to other side edge i is current of three-dimensional grid 1 multiplied by weight $w_i$ of that side edge i. Next, consider three-dimensional grid 2. Three-dimensional grid 2 contains circuit module A2 and circuit module B. In one embodiment, for each of circuit module A2 and circuit module B, distances from its center to respective side edges S3, S4, S5, S6 are calculated as described above, current distributed from the circuit module to respective side edges are calculated based on these distances, and then current distributed to a same side edge by the two circuit modules A2 and B are superposed to be taken as current distributed from the three-dimensional grid to that side edge. For example, for side edge S3, assumed current distribution weight of that side edge with respect to circuit module A2 is $W_A$, current distribution weight with respect to circuit module B is $W_B$, then current distributed to side edge S3 from three-dimensional grid 2 may be represented as $w_A*I_A/3+w_B*I_B$.

In another embodiment, for a plurality of circuit modules contained in a three-dimensional grid, the plurality of circuit modules are first clustered into an overall circuit module and center of that overall circuit module is determined. In an example, geometrical center of the plurality of circuit modules on the whole may be calculated as the center of the overall circuit module. Alternatively, in another example, current and location of the plurality of circuit modules are considered in combination, and "barycenter" of the plurality of circuit modules is calculated as center of the overall circuit module. Then, current distribution weight of respective side edges of the three-dimensional grid with respect to that overall circuit module are calculated as described above, and finally, total current of the three-dimensional grid is distributed to respective side edges according to the calculated weight. For example, for the three-dimensional grid 2 of FIG. 10, circuit module A2 and circuit module B may be clustered into a total circuit module, and "barycenter" of the total circuit module is calculated based on location and current of circuit module A2 and circuit module B as center of the total circuit module. Next, distances from center of that total circuit module to side edges S3, S4, S5, S6 are calculated, thereby calculating combined current distribution weight of respective side edges. Finally, current distributed to side edge i is determined as total current of the three-dimensional grid multiplied by combined current distribution weight of that side edge.

Block 4321 of distributing current of three-dimensional grids to side edges based on location distribution of circuit modules in the three-dimensional grids has been described above in combination with detailed examples. Next, blocks 4322 and 4323 are performed as mentioned before to determine related three-dimensional grids of a side edge, and superpose current distributed from respective related three-dimensional grids to obtain current of that side edge.

Although examples of first distributing current of circuit modules to three-dimensional grids, and then determining current of side edges based on current of the three-dimensional grids have been described above in detail, these examples are merely intended to more clearly describe the process of calculating current of side edges without any limitation thereto. Those skilled in the art can make further modification upon reading the above described embodiments, and such modification should also be encompassed within conception of the present invention.

Figure 11A:
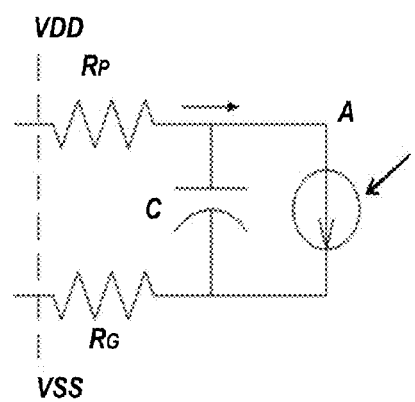
FIG. 11A shows an example of a simulation circuit according to an embodiment of the invention.
Figure 11B:
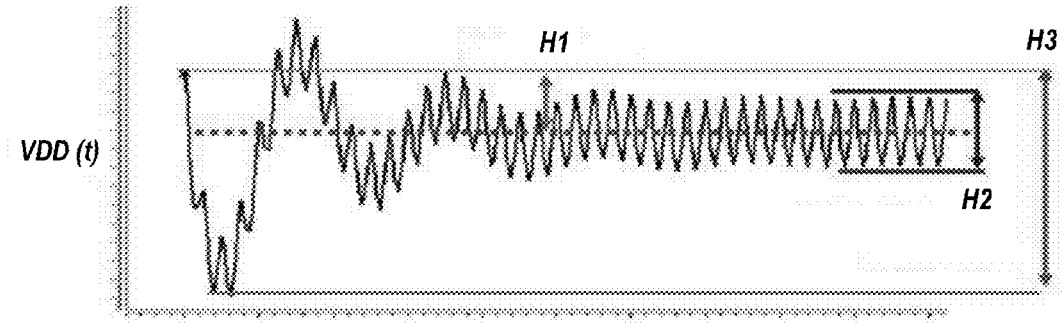
FIG. 11B shows a simulation structure according to an embodiment of the invention.

On basis that current of at least one side edge is determined at block 43, block 44 may be performed, in which the power supply of the 3D IC is estimated based on the determined current of the side edges. In one embodiment, estimating power supply of the 3D IC based on current of the side edges comprises: inputting the calculated current of side edges into a simulation circuit corresponding to the 3D IC, and estimating power supply of the 3D IC based on output result of the simulation circuit. The simulation circuit may be a virtual circuit that simulates actual current condition of the 3D IC based on physical characteristics of the 3D IC and the above obtained current of side edges. FIG. 11A depicts an example of the simulation circuit. As shown, the simulation circuit contains therein resistors $R_P$, $R_G$ and a capacitor C, wherein resistor $R_P$ represents resistance of the power supply, which is related to distribution and physical characteristics of solder balls in the 3D IC directly connected to an external powering grid and to physical characteristics of connecting columns among chips of the 3D IC; $R_G$ represents resistance of ground and may be set as needed; C represents capacitance of chips in the 3D IC and depends on properties of chips themselves. For such a simulation circuit, assume that current of a side edge determined at step 42 is inputted at location of the arrow, and result of the simulation circuit is measured at point A, then a voltage waveform depicted in FIG. 11B can be obtained. In FIG. 11B, height difference H1 between initial voltage value and voltage in steady-state corresponds to IR drop, amplitude H2 of voltage in steady-state is referred to as steady-state swing, and height difference H3 between initial voltage value and lowest voltage is referred to as step response amplitude. IR drop, steady-state swing and step response amplitude are common characteristic quantities used to estimate characteristics of power supply. By analyzing output result of the simulation circuit, various analyses may be performed on features of power supply of the 3D IC, such as its stability, robustness, SNR etc. It is appreciated that, the above simulation circuit is merely an illustration. In prior art, those skilled in the art are already capable of employing a variety of simulation circuits to conduct analysis and simulation on output signals. Accordingly, an appropriate simulation circuit similar to those in prior art may be utilized in step 44. However, the difference lies in that, in embodiments of the invention, current of side edges calculated through blocks 41-43 are applied to a simulation circuit to get simulation result, so as to analyze and estimate power supply of a 3D IC.

In one embodiment, estimating power supply of the 3D IC based on current of the side edges comprises: recording current of a plurality of side edges, thereby estimating current distribution in the 3D IC. Such current distribution information may be used in pre-simulation to design distribution of connecting columns among chips, or to improve a distribution that has been already designed. In case of post-simulation, current of connecting columns of the 3D IC may be simulated and verified based on current of side edges at block 44.

It is appreciated that, in addition to the above listed applications, current of side edges obtained at block 43 may be used to estimate and analyze power supply of a 3D IC in other embodiments. Thus, embodiments of the invention gridding a 3D IC based on design feature of the 3D IC, so as to determine current of side edges of three-dimensional grids as characteristic current of the 3D IC. Based on the determined characteristic current, power supply of the 3D IC may be analyzed and estimated in many embodiments, such as stability, noise, robustness etc. Thus, embodiments of the invention make it possible to perform power analysis directed to a 3D IC.

Figure 12:
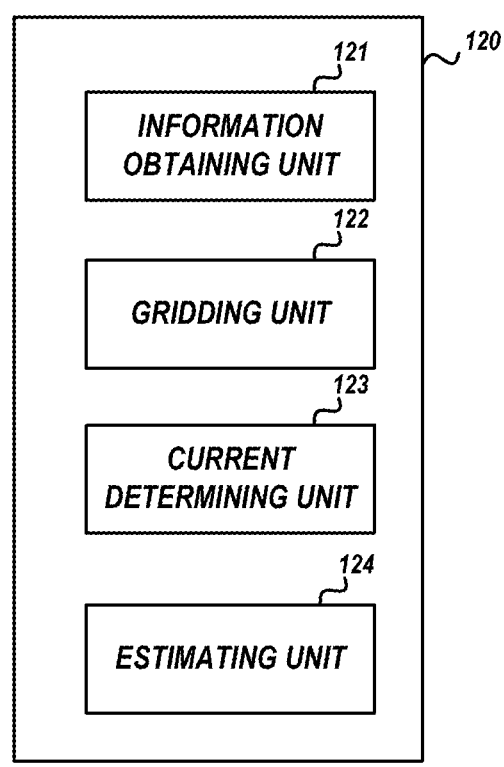
FIG. 12 shows a block diagram of an estimation apparatus according to an embodiment of the invention.

Under a same inventive conception, an embodiment of the invention also provides an apparatus of estimating power supply of a 3D IC. FIG. 12 depicts a block diagram of an estimation apparatus according to an embodiment. As shown in FIG. 12, the apparatus of estimating power supply of a 3D IC of the present embodiment is generally denoted as 120, and the apparatus 120 comprises: an information obtaining unit 121 configured to obtain current information and layout information of circuit modules contained in a specific region of the 3D IC; a gridding unit 122 configured to perform gridding on the specific region so as to form at least one three-dimensional grid having a plurality of side edges along chip stacking direction of the 3D IC; a current determining unit 123 configured to determine current of at least one of the plurality of side edges based on the current information and layout information of the circuit modules; and an estimating unit 124 configured to estimate power supply of the 3D IC based on the current of the at least one side edge.

In one embodiment, the information obtaining unit 121 is configured to obtain types of the circuit modules and query a circuit module information library based on the types of the circuit modules, thereby obtaining current information of the circuit modules.

In one embodiment, the current determining unit 123 is configured to: determine, based on layout information of the circuit modules, distances from the circuit modules to the at least one side edge, thereby determining current distribution weights of the circuit modules to the at least one side edge; perform weighted summation on current of at least a portion of circuit modules, and take result of summation as current of the at least one side edge.

In one embodiment, the current determining unit 123 comprises: a grid current distributing sub-unit (not shown) configured to distribute current to the at least one three-dimensional grid based on current information and layout information of the circuit modules; a side edge current calculating sub-unit (not shown) configured to calculate current of the at least one side edge based on current distributed to the at least one three-dimensional grid.

According to one embodiment, the grid current distributing sub-unit in the current determining unit 123 is configured to: determine, based on layout information of a circuit module j involved in a three-dimensional grid k in the at least one three-dimensional grid, a volume ratio of volume of that circuit module j falling within the three-dimensional grid k with respect to total volume of that circuit module j; sum current of respective circuit modules involved in the three-dimensional grid k with the volume ratio as weight, thereby determining current distributed to the three-dimensional grid k.

According to one embodiment, the side edge current calculating sub-unit in the current determining unit 123 is configured to: distribute current distributed to a three-dimensional grid to its relevant side edges; determine, for a side edge i in the at least one side edge, three-dimensional grids associated with the side edge i; superpose current distributed to the side edge i from respective three-dimensional grids associated with the side edge i, thereby determining current of the side edge i.

According to one embodiment, the side edge current calculating sub-unit is configured to evenly distribute current distributed to a three-dimensional grid to its relevant side edges.

According to one embodiment, the side edge current calculating sub-unit is configured to: for a circuit module j contained in a three-dimensional grid k, calculate distances from the circuit module j to respective side edges of the three-dimensional grid k based on layout information of that circuit module j; determine current distribution weights of respective side edges based the calculated distances; distribute a portion of current of the three-dimensional grid k that is corresponding to the circuit module j to respective side edges based on the determined current distribution weights.

In one embodiment, the side edge current calculating sub-unit is configured to: for a plurality of circuit modules contained in a three-dimensional grid k, calculate a barycenter common to the plurality of circuit modules based on layout information of the circuit modules, and calculate distances from that barycenter to respective side edges of the three-dimensional grid k; determine current distribution weights of respective side edges based the calculated distances; distribute total current of the three-dimensional grid k to respective side edges based on the determined current distribution weights.

According to one embodiment, the estimating unit 124 is configured to: inputting current of the at least one side edge into a simulation circuit corresponding to the 3D IC, and estimating power supply of the 3D IC based on output result of the simulation circuit.

For detailed execution manner of the above estimation apparatus 120, reference may be made to the description on the method of FIG. 4 in conjunction with detailed examples, which will not be described here for brevity. In one embodiment, the above estimation apparatus 120 may be implemented as an additional functional module or plug-in of an existing chip design tool to enhance functionality thereof. In one embodiment, the above estimation apparatus 120 may be implemented as a standalone estimation tool.

With the method and apparatus of embodiments of the invention, estimation and analyses of power supply may be effectively performed directed to features of 3D IC.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A computer program product for estimating power supply of a three dimensional (3D) integrated circuit (IC), the computer program product comprising a non-transitory computer readable storage medium having program instructions embodied therewith, the program instructions readable to cause a processing unit to:
  obtain current information and layout information of circuit modules contained in a specific region of the 3D IC;
  grid the specific region so as to form at least one three-dimensional grid having a plurality of side edges along chip stacking direction of the 3D IC;
  determine current of at least one side edge of the plurality of side edges based on the current information and layout information of the circuit modules by determining, based on layout information of circuit modules, distances from the circuit modules to the at least one side edge to determine current distribution weights of the circuit modules to the at least one side edge and performing weighted summation on current of at least a portion of the circuit modules as the current of the at least one side edge; and
  estimate power supply of the 3D IC based on the current of the at least one side edge.

2. The computer program product of claim 1, wherein the program instructions for obtaining current information of the circuit modules further cause the processing unit to:
  obtain types of the circuit modules; and
  query a circuit module information library based on the types of the circuit modules, thereby obtaining current information of the circuit modules.

3. A computer program product for estimating power supply of a three dimensional (3D) integrated circuit (IC), the computer program product comprising a non-transitory computer readable storage medium having program instructions embodied therewith, the program instructions readable to cause a processing unit to:
  obtain current information and layout information of circuit modules contained in a specific region of the 3D IC;
  grid the specific region so as to form at least one three-dimensional grid having a plurality of side edges along chip stacking direction of the 3D IC;
  determine current of at least one side edge of the plurality of side edges based on the current information and layout information of the circuit modules by distributing current to the at least one three-dimensional grid based on the current information and layout information of the circuit modules and calculating current of the at least one side edge based on current distributed to the at least one three-dimensional grid; and
  estimate power supply of the 3D IC based on the current of the at least one side edge.

4. The computer program product of claim 3, wherein the program instructions for distributing current to the at least one three-dimensional grid further cause the processing unit to:
  determine, based on layout information of a circuit module involved in a three-dimensional grid in the at least one three-dimensional grid, a volume ratio of volume of that circuit module falling within the three-dimensional grid with respect to total volume of that circuit module, and;
  summing current of respective circuit modules involved in the three-dimensional grid with the volume ratio as weight, thereby determining current distributed to the three-dimensional grid.

5. The computer program product of claim 4, wherein the program instructions for calculating the current of the at least one side edge based on the current distributed to the at least one three-dimensional grid further cause the processing unit to:
  distribute the current distributed to a three-dimensional grid to its relevant side edges;
  determine, for a side edge in the at least one side edge, three-dimensional grids associated with that side edge, and;
  superpose current distributed to the side edge from respective three-dimensional grids associated with the side edge, thereby determining current of the side edge.

6. The computer program product of claim 5, wherein the program instructions for distributing the current distributed to a three-dimensional grid to its relevant side edges further cause the processing unit to:
  evenly distribute current distributed to the three-dimensional grid to its relevant side edges.

7. The computer program product of claim 5, wherein the program instructions for distributing the current distributed to a three-dimensional grid to its relevant side edges further cause the processing unit to:
  for a circuit module contained in a three-dimensional grid, calculate distances from the circuit module to respective side edges of the three-dimensional grid based on layout information of that circuit module;
  determine current distribution weights of respective side edges based the calculated distances, and;
  distribute a portion of current of the three-dimensional grid that is corresponding to the circuit module to respective side edges based on the determined current distribution weights.

8. The computer program product of claim 5, wherein the program instructions for distributing the current distributed to a three-dimensional grid to its relevant side edges further cause the processing unit to:
  for a plurality of circuit modules contained in a three-dimensional grid, calculate a barycenter common to the plurality of circuit modules based on layout information of the circuit modules;
  calculate distances from that barycenter to respective side edges of the three-dimensional grid;
  determine current distribution weights of respective side edges based the calculated distances, and;
  distribute total current of the three-dimensional grid to respective side edges based on the determined current distribution weights.

9. The computer program product of claim 3, wherein the program instructions for obtaining current information of the circuit modules further cause the processing unit to:
  obtain types of the circuit modules; and
  query a circuit module information library based on the types of the circuit modules, thereby obtaining current information of the circuit modules.

* * * * *